(12) United States Patent
Lim et al.

(10) Patent No.: US 9,508,565 B2
(45) Date of Patent: Nov. 29, 2016

(54) SEMICONDUCTOR PACKAGE AND METHOD OF MANUFACTURING THE SAME

(71) Applicant: SAMSUNG ELECTRO-MECHANICS CO., LTD., Suwon-si (KR)

(72) Inventors: Jae Hyun Lim, Suwon-Si (KR); Do Jae Yoo, Suwon-Si (KR); Eun Jung Jo, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/798,833

(22) Filed: Jul. 14, 2015

(65) Prior Publication Data

US 2016/0020171 A1  Jan. 21, 2016

(30) Foreign Application Priority Data

Jul. 18, 2014  (KR) .................. 10-2014-0090994

(51) Int. Cl.
| | | |
|---|---|---|
| *H01L 21/66* | (2006.01) | |
| *H01L 21/78* | (2006.01) | |
| *H01L 21/768* | (2006.01) | |
| *H01L 23/00* | (2006.01) | |
| *H01L 23/31* | (2006.01) | |
| *H01L 21/56* | (2006.01) | |
| *H01L 23/14* | (2006.01) | |
| *H01L 23/498* | (2006.01) | |
| *H01L 21/48* | (2006.01) | |
| *H05K 1/00* | (2006.01) | |

(52) U.S. Cl.
CPC ......... *H01L 21/561* (2013.01); *H01L 21/4853* (2013.01); *H01L 21/565* (2013.01); *H01L 22/32* (2013.01); *H01L 23/145* (2013.01); *H01L 23/3107* (2013.01); *H01L 23/49811* (2013.01); *H05K 1/00* (2013.01); *H01L 22/14* (2013.01); *H01L 23/49827* (2013.01); *H01L 2924/0002* (2013.01)

(58) Field of Classification Search
CPC ............ H01L 21/565; H01L 21/76802; H01L 21/76877; H01L 21/76874; H01L 21/561; H01L 21/78; H01L 23/3107; H01L 23/481; H01L 23/145; H01L 23/49811; H01L 23/49827; H01L 2224/12105; H01L 2224/1302; H01L 24/11; H01L 22/00; H01L 22/10; H01L 2924/181; H01L 2224/16225

See application file for complete search history.

(56) References Cited

U.S. PATENT DOCUMENTS 8,097,490 B1 * 1/2012 Pagaila .................. H01L 21/561
257/E21.007
2011/0068481 A1   3/2011 Park et al.
(Continued)

FOREIGN PATENT DOCUMENTS

KR  10-2011-0032522 A  3/2011

*Primary Examiner* — Jasmine Clark
(74) *Attorney, Agent, or Firm* — NSIP Law

(57) ABSTRACT

The semiconductor package according to an exemplary embodiment includes: a substrate having a plurality of circuit layers and connection pads which are provided between a plurality of insulating layers; a plated tail part of which one end is electrically connected to the connection pad; a dicing part provided in contact with the other end of the plated tail part; a molded part provided on the substrate; and molded part vias provided on the connection pads and penetrating through the molded part.

12 Claims, 5 Drawing Sheets

(56) References Cited

U.S. PATENT DOCUMENTS

2012/0061814 A1* 3/2012 Camacho ............ H01L 21/4853
257/676
2013/0154108 A1* 6/2013 Lin ..................... H01L 23/5389
257/774
2013/0292684 A1* 11/2013 Nikitin .................... H01L 24/03
257/76
2014/0103509 A1* 4/2014 Yoon ................. H01L 23/49816
257/676

* cited by examiner

SEMICONDUCTOR PACKAGE AND METHOD OF MANUFACTURING THE SAME

CROSS-REFERENCE TO RELATED APPLICATION

This application claims the priority and benefit of Korean Patent Application No. 10-2014-0090994 filed on Jul. 18, 2014, with the Korean Intellectual Property Office, the disclosure of which is incorporated herein by reference.

BACKGROUND

The present disclosure relates to a semiconductor package and a method of manufacturing the same.

In accordance with the trend for the miniaturization of and high performance in information technology (IT) devices, mass storage memories and high performance integrated circuits (IC) have been required for use therein. Existing two-dimensional (2D) packages have reached the technical limits of simultaneously achieving the levels of integration and high performance that are currently required. In order to overcome these technical limits, a large amount of research aimed at manufacturing three-dimensional (3D) packages using a variety of methods has been conducted, and the development of new types of interconnection technology is required. As one of these methods, a double side packaging method in which both sides of a printed circuit board (PCB) are used has been used for packages provided in mobile devices.

SUMMARY

An aspect of the present disclosure provides a semiconductor package enabling an open/short test on a substrate by implementing a plated tail which is electrically connected to a plating line by forming solder balls in a sawing region of the package, and a method of manufacturing the same.

An aspect of the present disclosure also provides a semiconductor package enabling an open/short test on a substrate by implementing a plated tail which is electrically connected to a plating line by an electroless plating process, after additionally forming a molded part via hole in a sawing region of the package, and a method of manufacturing the same.

An aspect of the present disclosure also provides a semiconductor package capable of preventing defect such as delamination of a pad by leaving a plated tail after performing a sawing process, and a method of manufacturing the same.

According to an aspect of the present disclosure, a semiconductor package may include: a substrate having a plurality of circuit layers and connection pads formed between a plurality of insulating layers; a plated tail part of which one end is electrically connected to the connection pad; a dicing part formed so as to be in contact with the other end of the plated tail part; a molded part formed on the substrate; and molded part vias formed on the connection pads and formed so as to penetrate through the molded part.

The semiconductor package may further include a plurality of vias that electrically connect the plurality of circuit layers to each other.

According to another aspect of the present disclosure, a method of manufacturing a semiconductor package may include: preparing a substrate having a plurality of circuit layers and connection pads formed between a plurality of insulating layers and having openings for testing; forming a molded part on the substrate; forming molded part via holes so as to expose upper portions of the connection pads and penetrate through the molded part; and forming molded part vias by plating the molded part via holes.

In the preparing of the substrate, a plated tail part of which one end is electrically connected to the connection pad; and a dicing part formed so as to be in contact with the other end of the plated tail part or include a portion of the other end of the plated tail part may be formed.

In the preparing of the substrate, a plurality of vias that electrically connect the plurality of circuit layers to each other may be formed.

The dicing part may include the openings for testing.

The method may further include, after the preparing of the substrate, performing an open-short test.

The method may further include, before the forming of the molded part, forming solder balls in the openings for testing.

The method may further include, after the forming of the molding via holes, forming a seed layer by performing an electroless plating process for the molded part via holes and the openings for testing.

The method may further include, after the forming of the molded part vias, dicing and separating the dicing part.

Features and advantages of the present disclosure will be more obvious from the following description with reference to the accompanying drawings.

The terms and words used in the present specification and claims should not be interpreted as being limited to typical meanings or dictionary definitions, but should be interpreted as having meanings and concepts relevant to the technical scope of the present disclosure based on the rule according to which an inventor can appropriately define the concept of the term to describe most appropriately the best method he or she knows for carrying out the disclosure.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
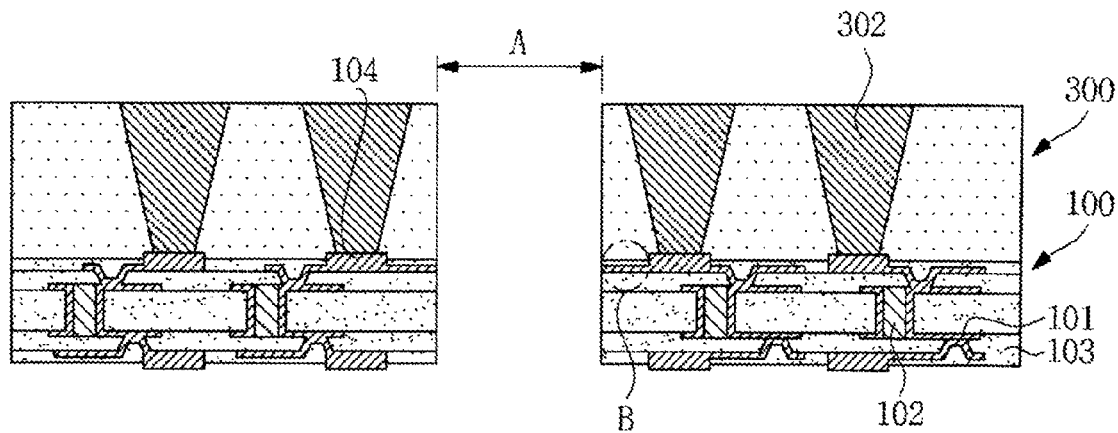
FIG. 1 is a cross-sectional view of a structure of a semiconductor package according to an embodiment in the present disclosure.

Numerous embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Semiconductor Package

FIG. 1 is a cross-sectional view of a semiconductor package according to an embodiment in the present disclosure.

As shown in FIG. 1, the semiconductor package may include a substrate 100 having a plurality of circuit layers 101 and connection pads 104 formed between a plurality of insulating layers 103, a plated tail part B of which one end is electrically connected to the connection pad 104, a dicing part A formed so as to be in contact with the other end of the plated tail part B, a molded part 300 formed on the substrate 100, and molded part vias 302 formed on the connection pads 104 and formed so as to penetrate through the molded part 300.

In addition, the semiconductor package may be provided with a plurality of vias 102 that electrically connect the plurality of circuit layers 101 to each other.

Here, as the insulating layer 103, a resin insulating layer may be used. As a material of the resin insulating layer, a thermosetting resin such as an epoxy resin, a thermoplastic resin such as polyimide, or a resin having a reinforcement material such as glass fiber or inorganic filler impregnated in the thermosetting resin and the thermoplastic resin, for example, prepreg may be used. In addition, a thermosetting resin, a photo-curable resin, and/or the like may be used. However, the material of the resin insulating layer is not particularly limited thereto.

In addition, the circuit layers 101 may be made of any material without being limited as long as it is used as a conductive metal for a circuit and be typically made of copper in a printed circuit board.

A surface treatment layer (not shown) may be further formed on the connection pad 104, if necessary. In this case, the surface treatment layer is not particularly limited as long as it is known in the art, but be formed by, for example, an electro gold plating, an immersion gold plating, an organic solderability preservative (OSP) or an immersion tin plating, an immersion silver plating, an electroless nickel and immersion gold (ENIG), a direct immersion gold (DIG) plating, a hot air solder leveling (HASL), or the like.

Here, due to a presence of the plated tail part B, mechanical reliability may be increased. For example, due to the plated tail part B formed so as to be connected to one end of the connection pad 104, defect such as delamination of the connection pad 104 may be reduced.

In addition, in case of a surface mounting, since solder resist simultaneously covers the connection pad 104 and the plated tail part B formed so as to be connected to the connection pad 104, a cover region may be increased, thereby reducing a delamination phenomenon of the connection pad.

In addition, the molded part 300 may be formed on the substrate 100.

In this case, the molded part 300 may be made of a material of silicone gel, epoxy molded compound (EMC), or the like, but is not particularly limited thereto.

Figure 2:
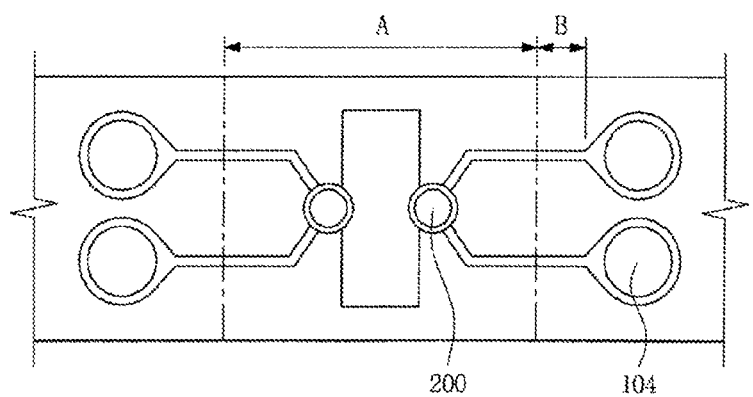
FIG. 2 is a plan view of the semiconductor package according to an embodiment in the present disclosure.

FIG. 2 is a plan view of the semiconductor package according to an embodiment in the present disclosure.

The plated tail part B that is electrically connected to one end of the connection pad 104 may be formed.

Method of Manufacturing Semiconductor Package First Embodiment

FIGS. 3 through 8 are views illustrating a method of manufacturing a semiconductor package according to a first embodiment in the present disclosure.

Figure 3:
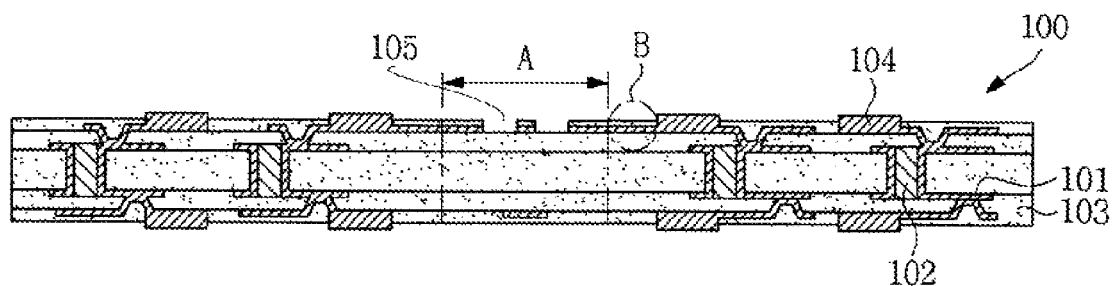
FIGS. 3 through 8 are views illustrating a method of manufacturing a semiconductor package according to a first embodiment in the present disclosure.

As shown in FIG. 3, a substrate 100 having a plurality of circuit layers 101 and connection pads 104 formed between a plurality of insulating layers 103 and having openings 105 for testing is prepared.

Here, a plurality of vias 102 that electrically connect the plurality of circuit layers 101 to each other may be further formed.

Here, as the insulating layer 103, a resin insulating layer may be used. As a material of the resin insulating layer, a thermosetting resin such as an epoxy resin, a thermoplastic resin such as polyimide, or a resin having a reinforcement material such as glass fiber or inorganic filler impregnated in the thermosetting resin and the thermoplastic resin, for example, prepreg may be used. In addition, a thermosetting resin, a photo-curable resin, and/or the like may be used. However, the material of the resin insulating layer is not particularly limited thereto.

In addition, the circuit layers 101 may be made of any material without being limited as long as it is used as a conductive metal for a circuit and be typically made of copper in a printed circuit board.

A surface treatment layer (not shown) may be further formed on the connection pad 104, if necessary. In this case, the surface treatment layer is not particularly limited as long as it is known in the art, but be formed by, for example, an electro gold plating, an immersion gold plating, an organic solderability preservative (OSP) or an immersion tin plating, an immersion silver plating, an electroless nickel and immersion gold (ENIG), a direct immersion gold (DIG) plating, a hot air solder leveling (HASL), or the like.

In addition, a plated tail part B of which one end is electrically connected to the connection pad 104 and a dicing part A formed so as to be in contact with the other end of the plated tail part B and include a portion of the other end of the plated tail part B may be formed.

In this case, the opening 105 for testing may be formed so as to be included in the dicing part A and may be formed so as to expose the insulating layer 103.

In addition, the opening 105 may have various sizes and may be formed at any position in the dicing part A.

Next, an open-short test may be performed at a substrate level in which the opening 105 is formed.

Specifically, the plated tail part B connected to one end of the connection pad 104 may be discontinuously formed in the dicing part A, due to the opening 105 formed on the substrate 100.

Thereby, a conduction line of the plated tail part B is blocked, such that the open-short test may be performed at the substrate level.

Figure 4:
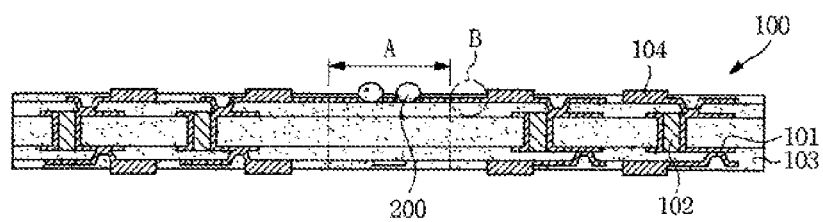

As shown in FIG. 4, the opening 105 may be filled with solder by performing a soldering process.

Thereby, a conduction line of the dicing part A may be connected. This allows electricity to flow in a plated region in order to perform an electroplating.

Figure 5:
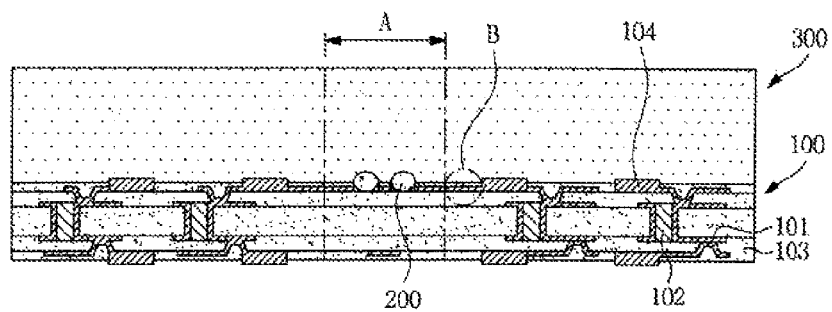

As shown in FIG. 5, a molded part 300 may be formed so as to cover an upper portion of the substrate 100.

In this case, the molded part 300 may be made of a material of silicone gel, epoxy molded compound (EMC), or the like, but is not particularly limited thereto.

Figure 6:
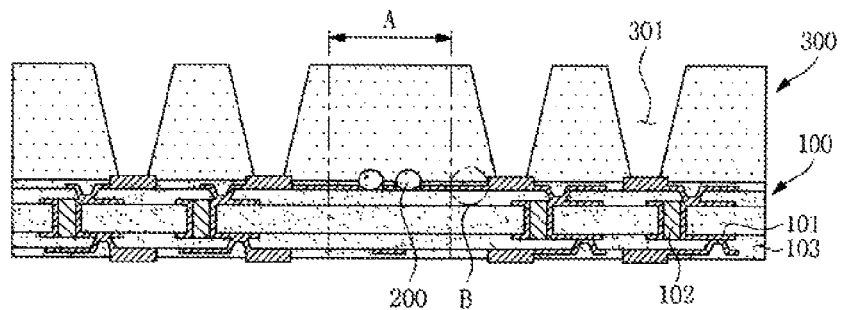

As shown in FIG. 6, molded part via holes 301 may be formed. In this case, the molded part via hole 301 may be formed so as to expose an upper portion of the connection pad 104 and penetrate through the molded part 300.

Here, the molded part via hole 301 may be machined by using a laser drill such as a $CO_2$ laser drill, a YAG laser drill, or the like, but is not particularly thereto.

Figure 7:
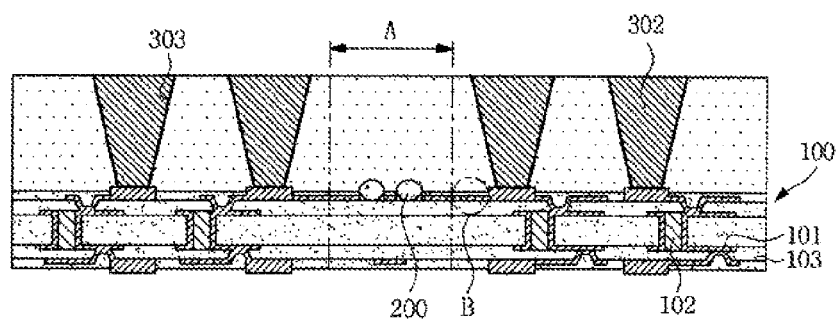

As shown in FIG. 7, molded part vias 302 may be formed by plating the molded part via holes 301.

Figure 8:
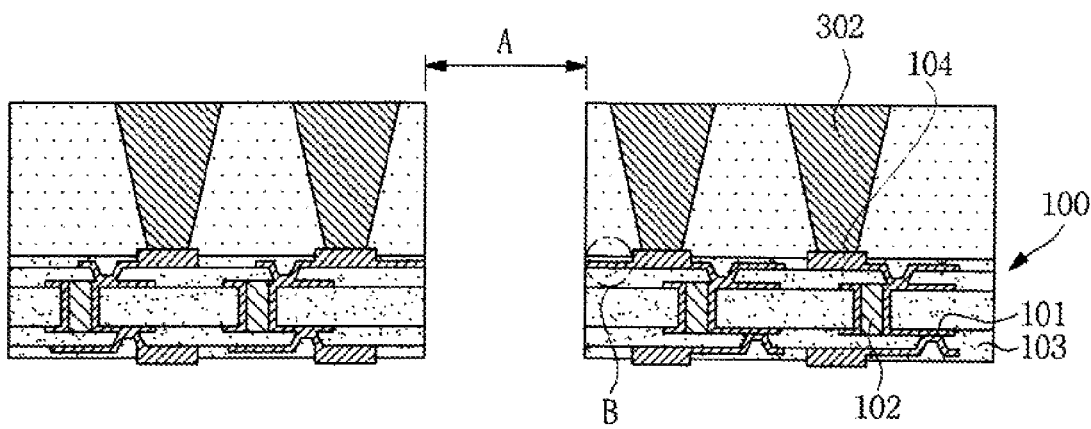

As shown in FIG. 8, the dicing part A may be diced. In this case, a portion of the plated tail part B may be left.

Here, due to a presence of the plated tail part B, mechanical reliability may be increased. For example, due to the plated tail part B formed so as to be connected to one end of the connection pad 104, defect such as delamination of the connection pad 104 may be reduced.

In addition, in case of a surface mounting, since solder resist simultaneously covers the connection pad 104 and the plated tail part B formed so as to be connected to the connection pad 104, a cover region may be increased, thereby reducing a delamination phenomenon of the connection pad.

Second Embodiment

FIGS. 9 through 13 are views illustrating a method of manufacturing a semiconductor package according to a second embodiment in the present disclosure.

Figure 9:
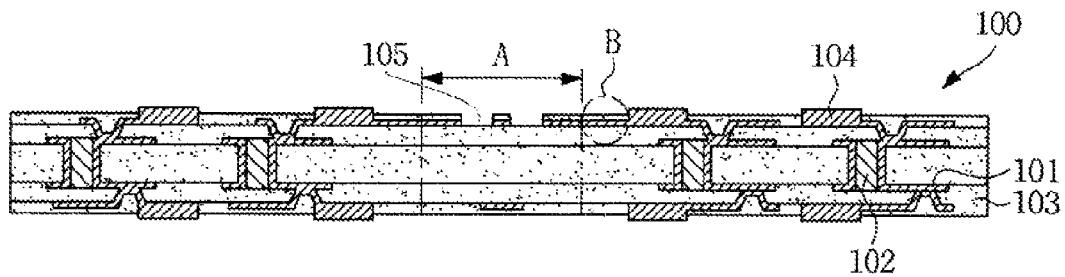
FIGS. 9 through 13 are views illustrating a method of manufacturing a semiconductor package according to a second embodiment in the present disclosure.

As shown in FIG. 9, a substrate 100 having a plurality of circuit layers 101 and connection pads 104 formed between a plurality of insulating layers 103 and having openings 105 for testing is prepared.

Here, a plurality of vias 102 that electrically connect the plurality of circuit layers 101 to each other may be further formed.

In addition, as the insulating layer 103, a resin insulating layer may be used. As a material of the resin insulating layer, a thermosetting resin such as an epoxy resin, a thermoplastic resin such as polyimide, or a resin having a reinforcement material such as glass fiber or inorganic filler impregnated in the thermosetting resin and the thermoplastic resin, for example, prepreg may be used. In addition, a thermosetting resin, a photo-curable resin, and/or the like may be used. However, the material of the resin insulating layer is not particularly limited thereto.

In addition, the circuit layers 101 may be made of any material without being limited as long as it is used as a conductive metal for a circuit and be typically made of copper in a printed circuit board.

A surface treatment layer (not shown) may be further formed on the connection pad 104, if necessary. In this case, the surface treatment layer is not particularly limited as long as it is known in the art, but be formed by, for example, an electro gold plating, an immersion gold plating, an organic solderability preservative (OSP) or an immersion tin plating, an immersion silver plating, an electroless nickel and immersion gold (ENIG), a direct immersion gold (DIG) plating, a hot air solder leveling (HASL), or the like.

In addition, a plated tail part B of which one end is electrically connected to the connection pad 104 and a dicing part A formed so as to be in contact with the other end of the plated tail part B and include a portion of the other side of the plated tail part B may be formed.

In this case, the opening 105 for testing may be formed so as to be included in the dicing part A and may be formed so as to expose the insulating layer 103.

In addition, the opening 105 may have various sizes and may be formed at any position in the dicing part A.

Next, an open-short test may be performed on a substrate level in which the opening 105 is formed.

Specifically, the plated tail part B connected to one end of the connection pad 104 may be discontinuously formed in the dicing part A, due to the opening 105 formed on the substrate 100.

Thereby, a conduction line of the plated tail part B is blocked, such that the open-short test may be performed at the substrate level.

Figure 10:
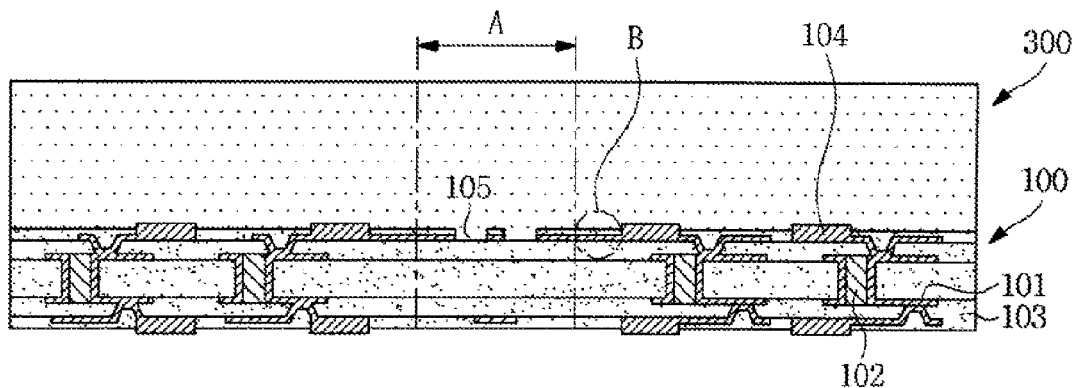

As shown in FIG. 10, a molded part 300 may be formed so as to cover an upper portion of the substrate 100.

In this case, the molded part 300 may be made of a material of silicone gel, epoxy molded compound (EMC), or the like, but is not particularly limited thereto.

Figure 11:
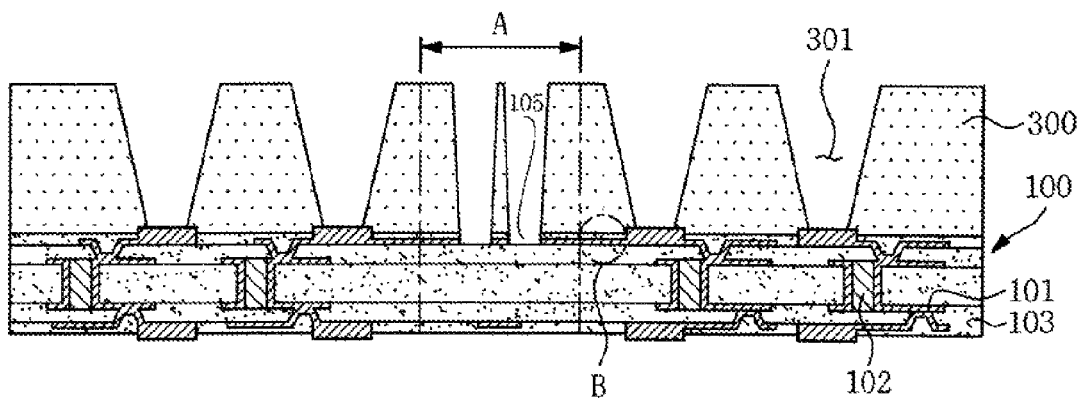

As shown in FIG. 11, molded part via holes 301 may be formed so as to penetrate through the molded part 300.

In this case, the molded part via hole 301 may be formed so as to expose an upper portion of the connection pad 104 and penetrate through the molded part 300.

Figure 12:
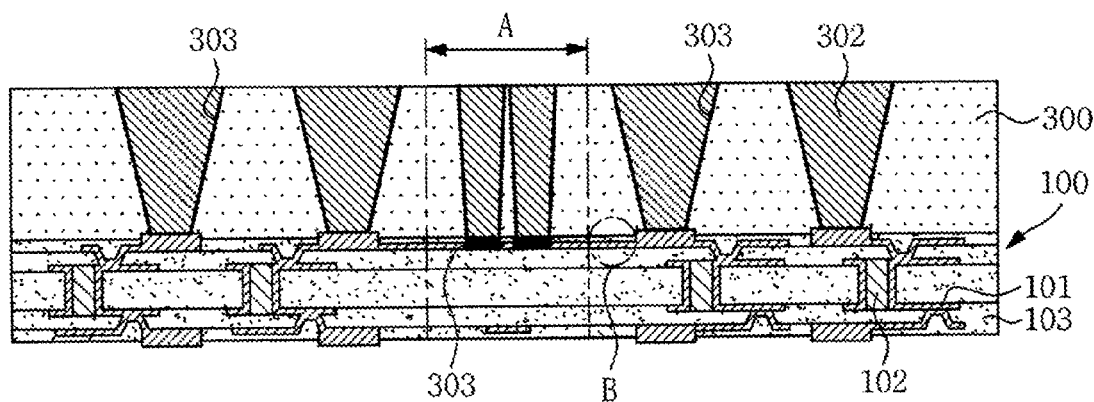

As shown in FIG. 12, an electroless plated layer 303 may be formed.

In this case, the electroless plated layer 303 may fill the opening 105 of the dicing part A.

Thereby, a conduction line of the dicing part A may be connected. This allows electricity to flow in a plated region in order to perform an electroplating.

Since the electroless plating process is a plating process for an insulator, reaction by electrically charged ions may not be expected. The electroless plating process may be performed by a precipitation reaction, and the precipitation reaction may be promoted by catalyst. In order to precipitate copper from a plating solution, the catalyst needs to be attached to a surface of a material to be plated. This means that the electroless plating requires a plurality of pre-processes.

As an example, the electroless plating process may include a cleanet operation, a soft etching operation, a pre-catalyst operation, a catalyst treatment operation, an accelerator operation, an electroless plating operation, and an anti-oxidation treatment operation.

In the cleanet operation, after oxides or foreign materials, particularly, oil, or the like that are present on upper and lower copper foil surfaces are removed with chemicals containing an acid or alkali surface active agent, the surface active agent may be perfectly cleaned. In the soft etching operation, fine roughness (e.g., about 1 µm to 2 µm) is formed on the upper and lower copper foil surfaces, such that copper particles may be closely adhered to each other in the plating process and contaminants that are not processed in the cleanet operation may be removed. In the pre-catalyst operation, the substrate is immersed in catalyst chemicals having low concentration, thereby preventing the chemicals used in a catalyst treatment operation from being contaminated or a concentration thereof from being changed. Moreover, since the substrate is immersed in advance in a bath having the chemicals made of the same component, the catalyst treatment may be further activated. The pre-catalyst operation may use catalyst chemicals which are diluted at 1% and 3%.

In the catalyst treatment operation, catalyst particles may be coated on copper foil of the substrate and surfaces of the insulating resin layer (i.e., side walls of the via hole). As the catalyst particle, a Pd—Sn compound may be used and the Pd—Sn compound may serve to promote the plating by a coupling of $Cu^{2+}$ and $Pd^{2-}$ which are particles to be plated. In the electroless plating operation, the plating solution may be made of $CuSO_4$, HCHO, NaOH, and other stabilizers. In order to consistently perform a plating reaction, a chemical reaction needs to be balanced. To this end, it is important to control composition of the plating solution. In order to maintain the composition, a proper supply of insufficient components, mechanical stirring, a circulation system of the plating solution, and the like need to be properly operated. A filter for products generated as a result of the reaction may be required and a use time of the plating solution may be extended by utilizing the filter.

In the anti-oxidation treatment operation, an anti-oxidation layer may be coated on the overall surface in order to prevent the plated layer from being oxidized due to the alkali component which is left after performing the electroless plating process.

However, since the above-mentioned electroless plating process generally has deteriorated physical characteristics as compared to the electroplating process, the electroless plated layer may be formed to be thin.

Next, after the electroless plated layer 303 is formed, molded part vias 302 may be formed by performing the electroplating process for the molded part via holes 301.

Figure 13:
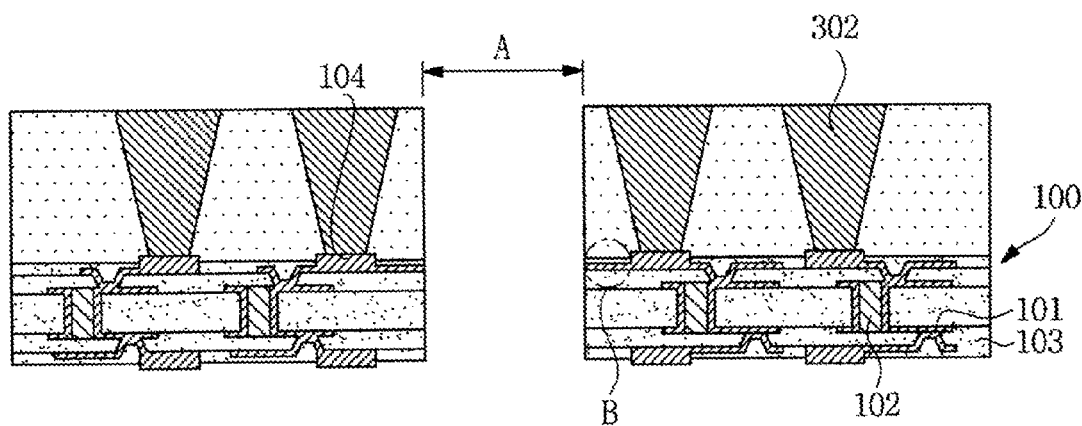

As shown in FIG. 13, the dicing part A may be diced. In this case, a portion of the plated tail part B may be left.

Here, due to a presence of the plated tail part B, mechanical reliability may be increased. For example, due to the plated tail part B formed so as to be connected to one end of the connection pad 104, defects such as delamination of the connection pad 104 may be reduced.

In addition, in the case of a surface mounting, since solder resist simultaneously covers the connection pad 104 and the plated tail part B formed so as to be connected to the connection pad 104, a cover region may be increased, thereby reducing a delamination phenomenon of the connection pad.

While various embodiments have been shown and described above, it will be apparent to those skilled in the art that modifications and variations could be made without departing from the scope of the present invention as defined by the appended claims.

What is claimed is:

1. A semiconductor package comprising:
   a substrate comprising circuit layers and connection pads, which are provided between insulating layers;
   a plated tail part comprising an end electrically connected to a connection pad of the connection pads;
   a dicing part provided in contact with another end of the plated tail part;
   a molded part provided on the substrate; and
   molded part vias provided on the connection pads and penetrating through the molded part.

2. The semiconductor package of claim 1, further comprising: vias configured to electrically connect the circuit layers to each other.

3. The semiconductor package of claim 1, wherein the plated tail extends beneath an insulating layer, of the insulating layers, from the connection pad to reduce delamination of the connection pad.

4. The semiconductor package of claim 1, wherein the plated tail forms an open line from the connection pad.

5. A method of manufacturing a semiconductor package, the method comprising:
   preparing a substrate comprising openings for testing, circuit layers, and connection pads, which are provided between insulating layers;
   forming a molded part on the substrate;
   forming molded part via holes configured to expose upper portions of the connection pads and penetrate through the molded part; and
   forming molded part vias by performing plating on the molded part via holes.

6. The method of claim 5, wherein the substrate comprises: a plated tail part of which one end is electrically connected to a connection pad of the connection pads, and a dicing part formed to be in contact with another end of the plated tail part or to comprise a portion of the another end of the plated tail part.

7. The method of claim 5, wherein the substrate comprises vias configured to electrically connect the circuit layers to each other.

8. The method of claim 6, wherein the dicing part comprises the openings for testing.

9. The method of claim 5, further comprising: after the preparing of the substrate, performing an open-short test.

10. The method of claim 5, further comprising: before the forming of the molded part, forming solder balls in the openings for testing.

11. The method of claim 5, further comprising: after the forming of the molded via holes, forming a seed layer by performing electroless plating on the molded part via holes and the openings for testing.

12. The method of claim 6, further comprising: after the forming of the molded part vias, dicing the substrate in the dicing part to be separated into packages.

* * * * *